United States Patent [19]

Hager et al.

[11] 3,979,232

[45] Sept. 7, 1976

[54] MERCURY CADMIUM TELLURIDE ANNEALING PROCEDURE

[75] Inventors: Robert J. Hager, Minneapolis; Joseph L. Schmit, Hopkins; M. Walter Scott; Ernest L. Stelzer, both of Minnetonka, all of Minn.

[73] Assignee: Honeywell Inc., Minneapolis, Minn.

[22] Filed: Feb. 28, 1975

[21] Appl. No.: 554,294

[52] U.S. Cl. .................... 148/20.3; 148/1.5
[51] Int. Cl.² ........................... C22F 1/02
[58] Field of Search ............ 148/1.5, 13, 13.1, 20.3, 148/3; 75/134 H, 135, 151, 169; 252/62.3 ZT, 62.3 V, 501; 423/508

[56] References Cited
UNITED STATES PATENTS
3,723,190    3/1973    Kruse et al. .......................... 148/1.5

*Primary Examiner*—R. Dean
*Attorney, Agent, or Firm*—David R. Fairbairn

[57] ABSTRACT

The stoichiometry and free-carrier concentration of mercury cadmium telluride is adjusted by a heat treatment. Mercury cadmium telluride is heat treated in the presence of mercury and cadmium vapor.

14 Claims, 2 Drawing Figures

MERCURY CADMIUM TELLURIDE ANNEALING PROCEDURE

REFERENCE TO CO-PENDING APPLICATIONS

Reference should be made to a co-pending application Ser. No. 554,293 by R. J. Camp, Jr., M. L. Hitchell, J. L. Schmit, and E. L. Stelzer entitled "Heat Treatment of Mercury Cadmium Telluride" which was filed on even date herewith and which is assigned to the same assignee as the present application.

BACKGROUND OF THE INVENTION

The present invention is concerned with the growth of mercury cadmium telluride. In particular, the present invention is directed to the adjustment of stoichiometry in mercury cadmium telluride. For the purposes of this specification, the common chemical equations for mercury cadmium telluride, (Hg,Cd)Te or $Hg_{1-x}Cd_xTe$, will be used.

(Hg,Cd)Te is an intrinsic photodetector material which consists of a mixture of cadmium telluride, a wide gap semiconductor ($E_g$=1.6 eV), with mercury telluride, which is a semi-metal having a "negative energy gap" of about −0.3 eV. The energy gap of the alloy varies linearly with $x$, the mole fraction of cadmium telluride in the alloy. By properly selecting $x$, it is possible to obtain (Hg,Cd)Te detector material having a peak response over a wide range of infrared wavelengths.

(Hg,Cd)Te is of particular importance as a detector material for the important 8 to 14 micron atmospheric transmission "window". Extrinsic photoconductor detectors, notably mercury-doped germanium, have been available with high performance in the 8 to 14 micron wavelength interval. These extrinsic photoconductors, however, require very low operating temperatures (below 30°K). (Hg,Cd)Te intrinsic photodetectors having a spectral cutoff of 14 microns, on the other hand, are capable of high performance at 77°K.

The possible application of (Hg,Cd)Te as an intrinsic photodetector material for infrared wavelengths was first suggested by W. G. Lawson et al, *J. Phys. Chem. Solids*, 9, 325 (1959). Since that time extensive investigation of (Hg,Cd)Te has been performed. High performance (Hg,Cd)Te detectors have been achieved for wavelengths from about 1 to 30 microns.

Despite the potential advantages of (Hg,Cd)Te as an infrared detector material, (Hg,Cd)Te photodetectors have only recently found wide use in infrared detector systems. The main drawback of (Hg,Cd)Te has been the difficulty in preparing high quality, uniform material in a consistent manner. The preparation of (Hg,Cd)Te crystals having n-type conductivity, which is the desired conductivity type for photoconductive detectors, has been found to be particularly difficult.

Several properties of the Hg—Cd—Te alloy system cause the difficulties which have been encountered in preparing (Hg,Cd)Te. First, the phase diagram for the alloy shows a marked difference between the liquidus and solidus curves, thus resulting in segregation of CdTe with respect to HgTe during crystal growth. Conventional crystal growth methods, which involve slow cooling along the length of an ingot, produce an extremely inhomogenous body of (Hg,Cd)Te. Second, the high vapor pressure of Hg over the melt makes it difficult to maintain melt stoichiometry. Third, the segregation of excess Te can give rise to pronounced constitutional supercooling.

The crystal preparation technique which has been most successful in producing high quality (Hg,Cd)Te is the technique described by P. W. Kruse et al in U.S. Pat. No. 3,723,190. This technique involves the bulk growth of homogenous (Hg,Cd)Te alloy crystals by a three part method. First, a liquid solution of the desired alloy composition is quenched to form a solid body of (Hg,Cd)Te. Second, the body is annealed at a temperature near but below the solidus temperature to remove dendrites. Third, the (Hg,Cd)Te is annealed at low temperature in the presence of excess Hg to adjust stoichiometry. This final low temperature anneal takes about 10 to 30 days.

The third part of the Kruse et al technique is necessary because a significant fraction of the mercury cadmium telluride crystals grown are p-type due to an excess density of native acceptor defects. The standard procedure to convert this material to n-type is to cut the crystal into planks or slices and then anneal them at approximately 300°C in a mercury atmosphere for 10 to 30 days. Many of the slices then have a thin n-type layer at the surface. Although much of this material is of detector quality, the thickness of the layer causes fabrication problems. Neither the thickness nor the yield, however, can be increased by annealing for longer periods. We have found that in the 10 to 30 day anneal time, the system has not equilibrated. If annealed for longer periods, the slices which had the thin n-type layer after 30 days will revert back to entirely p-type.

SUMMARY OF THE INVENTION

The method of the present invention resolves the yield and thickness problems. The mercury cadmium telluride is heat treated (or "annealed") in the presence of mercury and cadmium vapor for a time of sufficient duration to adjust stoichiometry and free-carrier concentration. The mercury and cadmium vapors are supplied by a source or sources other than the sample being heat treated.

A BRIEF DESCRIPTION OF THE DRAWINGS

DETAILED DESCRIPTION OF THE PREFERRED EMBODIMENTS

The present invention is a heat treatment for mercury cadmium telluride which allows the adjustment of stoichiometry, conductivity type and free-carrier concentration. These adjustments have two objectives. First, the desired mercury cadmium telluride should have n-type conductivity with a low free-carrier concentration. This material is highly advantageous for photodetector applications. Second, the acceptor concentration should be as low as possible while still meeting the first objective.

The free-carrier concentration of mercury cadmium telluride can be described in terms of the number of donors caused by foreign atoms or impurities, $N_{Di}$; the number of donors caused by stoichiometric defects, $N_{Ds}$; the number of acceptors caused by foreign atoms, $N_{Ai}$; and the number of acceptors caused by stoichiometric defects, $N_{As}$. The free-carrier concentration is given by the expression $$n_0 = (N_{Di} + N_{Ds}) - (N_{Ai} + N_{As}) + p_0.$$

We have found that the dominant terms of this equation are the native acceptors, $N_{As}$, and the foreign donors, $N_{Di}$. The free-carrier concentration, therefore, is determined $N_{Di} - N_{As}$.

The present invention controls conductivity type and free-carrier concentration by adjusting the native acceptor concentration.

In the present invention, mercury cadmium telluride is annealed in a closed environment in the presence of an added excess of Hg and powdered (Hg,Cd)Te of the same composition as the (Hg,Cd)Te being annealed. This differs from the prior art technique, in which the mercury cadmium telluride was annealed only in the presence of an added excess of Hg.

In the preferred embodiments, the mercury cadmium telluride slices are placed in a container (or capsule) which contains excess mercury and excess mercury cadmium telluride powder. The finely divided powder is of the same general composition as the materials to be annealed. The excess mercury and mercury cadmium telluride powder provide mercury, cadmium, and tellurium vapor when the slices and the excess materials are heated.

Figure 1:
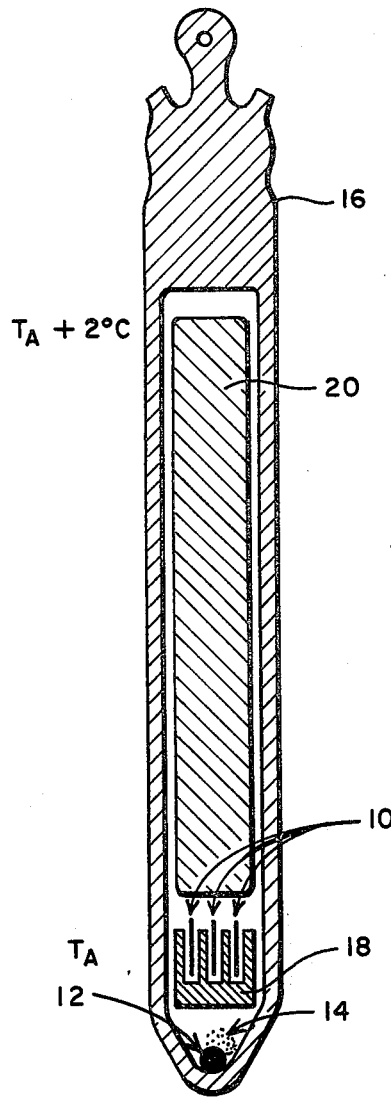
FIG. 1 shows apparatus which may be used for the heat treatment of the present invention.

In the embodiment of the present invention shown in FIG. 1, mercury cadmium telluride slices 10, excess mercury 12, and excess mercury cadmium telluride powder 14 are placed in container 16 such as a quartz ampoule. Container 16 is designed so that the material to be annealed is separated from the excess materials. Slices 10 are held by holder 18. Container is placed in a furnace and heated to between about 200°C and about 500°C. The container is then maintained at this temperature for a time of sufficient duration to adjust stoichiometry, conductivity type, and free-carrier concentration. As shown in FIG. 1, a quartz plug 20 may also be placed in container 16 to reduce the container volume.

Figure 2:
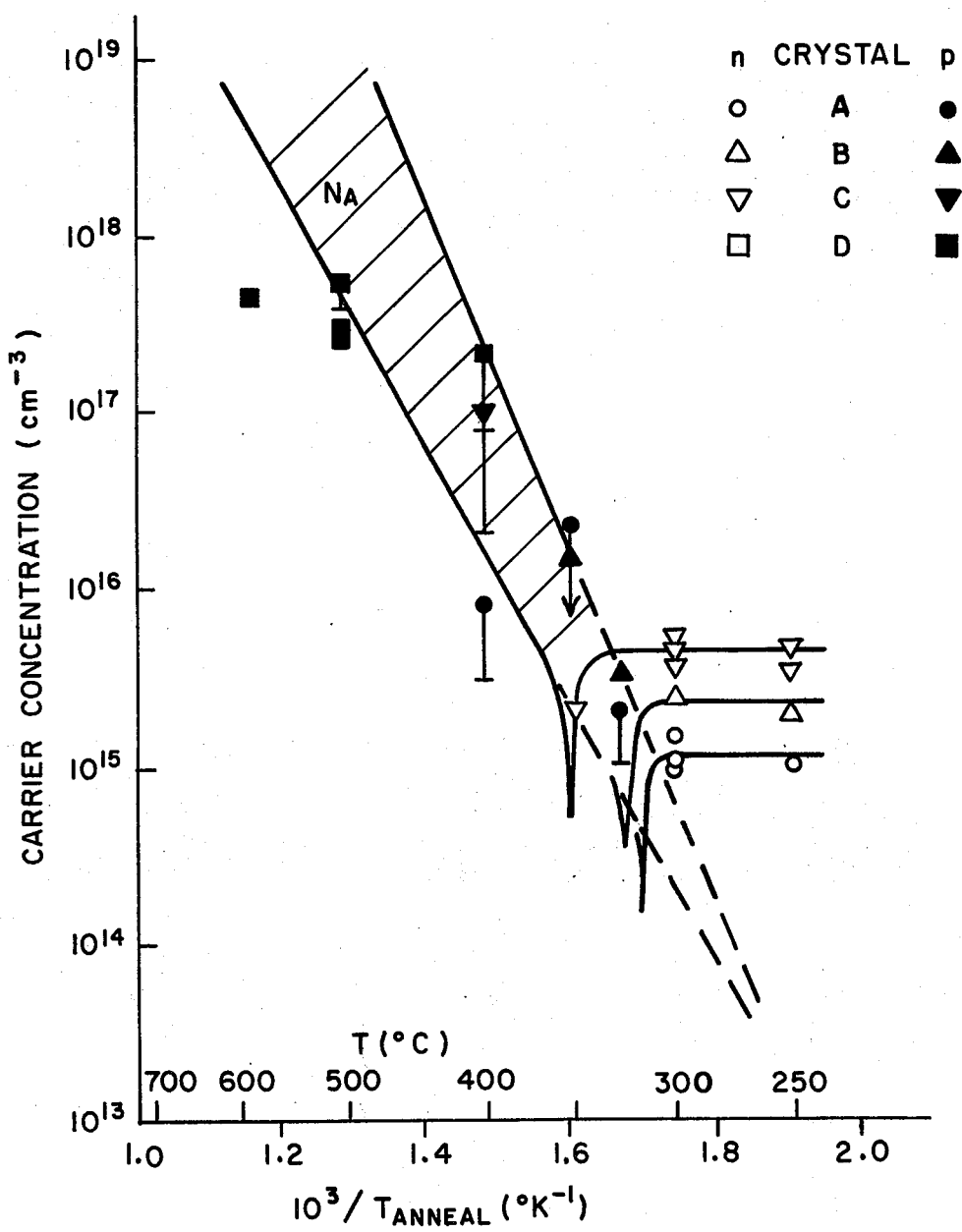
FIG. 2 shows carrier concentration as a function of annealing temperatures for $Hg_{0.6}Cd_{0.4}Te$ crystals.

The temperature of the heat treatment determines the native acceptor concentration, $N_{As}$. FIG. 2 shows carrier concentration in $Hg_{0.6}Cd_{0.4}Te$ crystals as a function of annealing temperature. These crystals were annealed using the method of the present invention. It can be seen that temperatures higher than about 350°C result in p-type material. In other words, the resulting native acceptor concentration exceeds the foreign donor concentration. If more impurity donors are present, then the maximum annealing temperature to obtain n-type will also increase. However, typically to obtain n-type material, annealing temperatures of between about 250° and 350°C should be used. The most preferred temperature for obtaining n-type material is approximately 300°C.

As shown in FIG. 2, at lower annealing temperatures the free-carrier concentration is dictated by the impurity density and is independent of temperature. In contrast, at higher temperatures, the free-carrier concentration is reduced by compensating native acceptors. At the highest temperatures, the acceptors dominate over the donors and the material is p-type.

In the method of the present invention, the slices are heat treated for between about 10 and about 120 days. The time required to convert the material completely to n-type depends on the thickness of the slice. A 300° anneal for 120 days is adequate for a slice of approximately 1.5 mm thick.

Thirty day anneals using the present invention have been effective in converting about 0.1 mm thickness of material to n-type. This is similar to the results obtained using only mercury vapor.

The significant improvement achieved by the present invention is with respect to longer anneals of materials in which only a thin n-type layer is converted by a 10 day mercury only anneal. Annealing with only mercury for longer periods converts these slices back to p-type. Using the method of the present invention, on the other hand, the slices can be converted entirely to n-type by annealing for periods greater than 10 days. Thus, both the yield of n-type material and the thickness of the conversion to n-type is improved using the method of the present invention.

The effectiveness of the present invention was experimentally verified by cutting slices of approximately 1.5 mm thickness from four $Hg_{0.6}Cd_{0.4}Te$ crystals. Two capsules were loaded with a slice from each of the four crystals. The capsules were identical, and each had a volume of approximately 11 cc. The void volume was approximately 10 cc.

Each capsule contained about 0.8 grams of excess mercury. One of the capsules contained approximately 1 gram of mercury cadmium telluride powder besides the excess mercury, the other capsule contained only excess mercury.

The capsules were then heated to 300°C in the same furnace at the same time and were maintained at that temperature for 123 days. After this anneal, the samples in the capsule with only excess mercury were p-type. In contrast, the samples in the capsule with excess mercury cadmium telluride powder were all n-type throughout as determined by thermoprobe and temperature dependent Hall effect measurements.

In another successful embodiment, $Hg_{0.6}Cd_{0.4}Te$ slices were annealed at 300°C for 50 days. The capsule contained 0.2 grams of excess mercury and 0.027 grams of mercury cadmium telluride powder. One millimeter thick slices of mercury cadmium telluride were entirely converted to n-type conductivity.

The present invention has also been used in conjunction with the heat treatment process described in the co-pending application Ser. No. 554,293 by R. J. Camp, Jr. et al. In that technique, the mercury cadmium telluride is heated to a temperature near but below the solidus temperature and then slowly cooled to room temperature. The slices of mercury cadmium telluride have been converted from p-type to n-type conductivity using excess mercury and mercury cadmium telluride powder.

Although this invention has been described with reference to a series of preferred embodiments, workers skilled in the art will recognize that modifications may be made without departing from the spirit and scope of the present invention. The essence of this invention is to provide the partial pressure of the constituent elements from a source other than the sample being annealed. The use of excess mercury and mercury cadmium telluride powder, therefore, has been described as a particularly convenient method of producing constituent vapors during the heat treatment. Other techniques of producing the constituent vapors, however, are also possible.

The embodiments of the invention in which an exclusive property or privilege is claimed are defined as follows:

1. A process for controlling the stoichiometry and free-carrier concentration of a mercury cadmium telluride alloy, the process comprising:
   providing a body of the alloy; and
   heat treating the body in the presence of mercury vapor and cadmium vapor from a mercury vapor source and a cadmium vapor source other than the body and maintaining the body at a temperature for a time of sufficient duration to adjust stoichiometry and free-carrier concentration.

2. The process of claim 1 wherein the temperature is between about 200°C and about 500°C.

3. The process of claim 2 wherein the temperature is between about 250°C and about 350°C.

4. The process of claim 1 wherein the time of sufficient duration is greater than about 10 days.

5. A method of adjusting the stoichiometry and free-carrier concentration of a body of mercury cadmium telluride, the method comprising heat treating, within a temperature range sufficient to adjust stoichiometry and free-carrier concentration, the body in a closed container in the presence of mercury vapor and cadmium vapor provided by a mercury vapor source and a cadmium vapor source within the closed container and placed remote from the body.

6. The method of claim 5 wherein the body is maintained at an essentially constant temperature for greater than about 10 days.

7. The method of claim 6 wherein the temperature is between about 200°C and about 500°C.

8. The method of claim 7 wherein the temperature is between about 250°C and about 350°C.

9. The method of claim 5 wherein the closed container also contains a tellurium vapor source placed remote from the body.

10. The method of claim 9 wherein the mercury, cadmium, and tellurium vapor sources comprise finely divided mercury cadmium telluride.

11. The method of claim 10 wherein the finely divided mercury cadmium telluride has approximately the same composition as that of the body.

12. The method of claim 10 wherein excess mercury is also provided.

13. A method of adjusting the stoichiometry of a body of mercury cadmium telluride, the method comprising heat treating the body in the presence of mercury and finely divided mercury cadmium telluride within a temperature range sufficient to adjust stoichiometry of the body, the mercury and finely divided mercury cadmium telluride being placed remote from the body and within a closed container to provide mercury, cadmium, and tellurium vapors during the heat treating.

14. In a method of controlling the stoichiometry and free-carrier concentration of a mercury cadmium telluride alloy by heat treating the body in the presence of mercury vapor in a closed environment within a temperature range sufficient to control stoichiometry and free-carrier concentration, the improvement comprising:
   inclusion of a quantity of finely divided mercury cadmium telluride as an additional constituent, the finely divided mercury cadmium telluride being placed remote from the body and within the closed environment, the finely divided mercury cadmium telluride being a source of mercury, cadmium, and tellurium vapors during the heat treating.

* * * * *